(12) United States Patent
Yamazaki

(10) Patent No.: US 9,281,237 B2
(45) Date of Patent: Mar. 8, 2016

(54) TRANSISTOR HAVING REDUCED CHANNEL LENGTH

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 13/632,761

(22) Filed: Oct. 1, 2012

(65) Prior Publication Data

US 2013/0092926 A1   Apr. 18, 2013

(30) Foreign Application Priority Data

Oct. 13, 2011   (JP) ................................. 2011-225524

(51) Int. Cl.
*H01L 29/786*   (2006.01)
*H01L 21/768*   (2006.01)
*H01L 27/108*   (2006.01)
(Continued)

(52) U.S. Cl.
CPC ........ *H01L 21/76834* (2013.01); *H01L 21/743* (2013.01); *H01L 21/76897* (2013.01); *H01L 27/10873* (2013.01); *H01L 27/1156* (2013.01);
(Continued)

(58) Field of Classification Search
CPC ............ H01L 29/7869; H01L 27/1225; H01L 29/66969; H01L 29/66742
USPC ........... 257/392, 368, 369, 412.347, E29.151; 438/275, 287, 139, 151
See application file for complete search history.

(56) References Cited

U.S. PATENT DOCUMENTS 5,091,763 A * 2/1992 Sanchez ..................... 257/344
5,528,032 A    6/1996 Uchiyama
(Continued)

FOREIGN PATENT DOCUMENTS

EP   1737044 A   12/2006
EP   2226847 A   9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Marc Armand
*Assistant Examiner* — Christina Sylvia
(74) *Attorney, Agent, or Firm* — Robinson Intellectual Property Law Office; Eric J. Robinson

(57) ABSTRACT

A transistor which includes an oxide semiconductor and can operate at high speed is provided. A highly reliable semiconductor device including the transistor is provided. An oxide semiconductor layer including a pair of low-resistance regions and a channel formation region is provided over an electrode layer formed in a groove of a base insulating layer. The channel formation region is embedded in a position overlapping with a gate electrode which has a side surface provided with a sidewall. The groove includes a deep region and a shallow region. The sidewall overlaps with the shallow region, and a connection portion between a wiring and the electrode layer overlaps with the deep region.

10 Claims, 10 Drawing Sheets

(51) Int. Cl.
*H01L 27/115* (2006.01)
*H01L 27/12* (2006.01)
*H01L 21/74* (2006.01)
*H01L 29/417* (2006.01)

(52) U.S. Cl.
CPC ...... *H01L 27/1203* (2013.01); *H01L 29/41733* (2013.01); *H01L 29/7869* (2013.01)

(56) References Cited

U.S. PATENT DOCUMENTS

| | | | |
|---|---|---|---|
| 5,545,581 A * | 8/1996 | Armacost et al. | 438/631 |
| 5,731,856 A | 3/1998 | Kim et al. | |
| 5,744,864 A | 4/1998 | Cillessen et al. | |
| 6,242,343 B1 | 6/2001 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,126,174 B2 | 10/2006 | Segawa et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,576,394 B2 | 8/2009 | Furuta et al. | |
| 7,674,650 B2 | 3/2010 | Akimoto et al. | |
| 7,732,819 B2 | 6/2010 | Akimoto et al. | |
| 7,910,490 B2 | 3/2011 | Akimoto et al. | |
| 7,932,521 B2 | 4/2011 | Akimoto et al. | |
| 7,981,734 B2 | 7/2011 | Furuta et al. | |
| 8,003,981 B2 | 8/2011 | Iwasaki et al. | |
| 8,071,434 B2 * | 12/2011 | Cheong et al. | 438/174 |
| 8,164,090 B2 | 4/2012 | Iwasaki et al. | |
| 8,207,025 B2 | 6/2012 | Suzawa et al. | |
| 8,247,813 B2 | 8/2012 | Koyama et al. | |
| 8,482,001 B2 | 7/2013 | Yamazaki et al. | |
| 8,633,480 B2 | 1/2014 | Yamazaki et al. | |
| 8,643,008 B2 | 2/2014 | Yamazaki et al. | |
| 8,907,336 B2 | 12/2014 | Shieh et al. | |
| 9,054,201 B2 | 6/2015 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0029591 A1 * | 2/2005 | Yudasaka | H01L 27/12 257/347 |
| 2005/0199959 A1 | 9/2005 | Chiang et al. | |
| 2005/0276115 A1 * | 12/2005 | Yamaguchi et al. | 365/185.22 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0237725 A1 * | 10/2006 | Jeong et al. | 257/66 |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 * | 3/2007 | Yabuta | 257/347 |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 * | 8/2007 | Hirao | H01L 21/02422 257/43 |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0140053 A1 | 6/2009 | Yamazaki et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0059742 A1 | 3/2010 | Shieh et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0136743 A1 | 6/2010 | Akimoto et al. | |
| 2010/0155721 A1 | 6/2010 | Lee et al. | |
| 2011/0086475 A1 | 4/2011 | Yamazaki et al. | |
| 2011/0089417 A1 | 4/2011 | Yamazaki et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0122670 A1 | 5/2011 | Yamazaki et al. | |
| 2011/0136301 A1 | 6/2011 | Yamazaki et al. | |
| 2011/0136302 A1 | 6/2011 | Yamazaki et al. | |
| 2011/0156023 A1 | 6/2011 | Ieda | |
| 2011/0163311 A1 | 7/2011 | Akimoto et al. | |
| 2011/0175087 A1 | 7/2011 | Yamazaki et al. | |
| 2011/0194331 A1 | 8/2011 | Kawae et al. | |
| 2011/0204362 A1 | 8/2011 | Akimoto et al. | |
| 2011/0212569 A1 | 9/2011 | Yamazaki et al. | |
| 2011/0212570 A1 | 9/2011 | Yamazaki et al. | |
| 2011/0250724 A1 | 10/2011 | Suzawa et al. | |

(56) References Cited

U.S. PATENT DOCUMENTS

| | | |
|---|---|---|
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263085 A1 | 10/2011 | Yamazaki |
| 2011/0263091 A1 | 10/2011 | Yamazaki |
| 2011/0269266 A1 | 11/2011 | Yamazaki |
| 2012/0018727 A1 | 1/2012 | Endo et al. |
| 2012/0032161 A1 | 2/2012 | Matsubayashi |
| 2012/0034743 A1 | 2/2012 | Suzawa et al. |
| 2012/0061670 A1 | 3/2012 | Suzawa et al. |
| 2012/0112184 A1 | 5/2012 | Yamazaki et al. |
| 2012/0146019 A1 | 6/2012 | Yamazaki et al. |
| 2012/0149147 A1 | 6/2012 | Yamazaki et al. |
| 2012/0161121 A1 | 6/2012 | Yamazaki |
| 2012/0161123 A1 | 6/2012 | Yamazaki |
| 2012/0161124 A1 | 6/2012 | Yamazaki |
| 2012/0161126 A1 | 6/2012 | Yamazaki |
| 2012/0187397 A1 | 7/2012 | Yamazaki et al. |
| 2012/0256177 A1* | 10/2012 | Yamazaki .......... H01L 29/7869 257/43 |
| 2012/0286260 A1 | 11/2012 | Noda et al. |
| 2012/0286262 A1 | 11/2012 | Koyama et al. |
| 2012/0315730 A1 | 12/2012 | Koezuka et al. |
| 2012/0315735 A1 | 12/2012 | Koezuka et al. |
| 2012/0319113 A1 | 12/2012 | Yamazaki |
| 2013/0069054 A1* | 3/2013 | Isobe .................. H01L 27/1225 257/43 |
| 2013/0075721 A1 | 3/2013 | Yamazaki et al. |
| 2013/0075722 A1 | 3/2013 | Yamazaki et al. |
| 2013/0075732 A1 | 3/2013 | Saito et al. |
| 2013/0075733 A1 | 3/2013 | Saito et al. |
| 2014/0131704 A1 | 5/2014 | Yamazaki et al. |
| 2015/0115260 A1 | 4/2015 | Shieh et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-074526 | 3/1999 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2007-096055 A | 4/2007 |
| JP | 2007-299850 A | 11/2007 |
| JP | 2008-535205 | 8/2008 |
| JP | 2009-224479 A | 10/2009 |
| JP | 2011-119718 A | 6/2011 |
| JP | 2011-151384 A | 8/2011 |
| WO | WO-2004/114391 | 12/2004 |
| WO | WO-2007/089048 | 8/2007 |
| WO | WO-2010/028269 | 3/2010 |
| WO | WO-2011/055620 | 5/2011 |
| WO | WO-2011/077946 | 6/2011 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IgZo Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel and Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimension Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW'02 : Proceedings of the 9th International Display Workshops, Dec. 4, 2002, pp. 295-298.

(56) References Cited

OTHER PUBLICATIONS

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FDP '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,Or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

(56) References Cited

OTHER PUBLICATIONS

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Morosawa.N et al., "35.3: Distinguished Paper: A Novel Self-Aligned Top-Gate Oxide TFT for AM-OLED Displays," SID Digest '11: SID International Symposium Digest of Technical Papers, May 17, 2011, pp. 479-482.

* cited by examiner

TRANSISTOR HAVING REDUCED CHANNEL LENGTH

BACKGROUND OF THE INVENTION

1. Field of the Invention

The present invention relates to a technique for miniaturizing semiconductor integrated circuits. The invention disclosed in this specification includes in its scope an element formed using a compound semiconductor, in addition to an element formed using a silicon semiconductor, as a component of a semiconductor integrated circuit, and relates to a semiconductor device manufactured using an oxide semiconductor as an example and a manufacturing method of the semiconductor device.

In this specification, a semiconductor device generally means a device which can function by utilizing semiconductor characteristics, and an electrooptic device, a semiconductor circuit, and electronic device are all semiconductor devices.

2. Description of the Related Art

In recent years, semiconductor devices have been developed to be used as an LSI, a CPU, or a memory. A CPU is an aggregation of semiconductor elements each provided with an electrode which is a connection terminal, which includes a semiconductor integrated circuit (including at least a transistor and a memory) using a semiconductor wafer.

A semiconductor circuit (IC chip) of an LSI, a CPU, or a memory is mounted on a circuit board, for example, a printed wiring board, to be used as one of components of a variety of electronic devices.

Silicon-based semiconductor materials are widely known as semiconductor materials that can be used for a transistor in a semiconductor circuit. For example, in Patent Document 1, a structure in which the distance between a channel formation region and a contact portion is shortened to reduce the resistance generated therebetween is proposed for higher integration.

Oxide semiconductors have been attracting attention as materials other than silicon. For example, in Patent Document 2 and Patent Document 3, a technique by which a transistor is manufactured using zinc oxide or an In—Ga—Zn-based oxide as an oxide semiconductor and is used as a switching element or the like of a pixel of a display device.

REFERENCE

[Patent Document 1] Japanese Published Patent Application No. 2004-327617
[Patent Document 2] Japanese Published Patent Application No. 2007-123861
[Patent Document 3] Japanese Published Patent Application No. 2007-096055

SUMMARY OF THE INVENTION

Objects are to obtain a minute transistor by reducing the channel length L of a transistor used in a semiconductor integrated circuit such as an LSI, a CPU, or a memory, to increase the operation speed of the circuit, and to reduce power consumption.

An object of one embodiment of the present invention is to provide a transistor which includes an oxide semiconductor and can be operated at high speed and a manufacturing method of the transistor. Another object of one embodiment of the present invention is to provide a highly reliable semiconductor device which includes the transistor and a manufacturing method of the semiconductor device.

A semiconductor integrated circuit such as an LSI, a CPU, or a memory is manufactured using a transistor in which a channel formation region is formed using an oxide semiconductor which is made to be an intrinsic or substantially intrinsic semiconductor by removal of impurities serving as electron donors (donors) from the oxide semiconductor and has a larger energy gap than a silicon semiconductor.

Contact resistance occurs between an oxide semiconductor and a conductive layer. The contact area between the oxide semiconductor and the conductive layer needs to be large enough to reduce the contact resistance.

In view of the above, a conductive layer in contact with a top surface of an oxide semiconductor layer and a conductive layer in contact with a bottom surface of the oxide semiconductor layer are provided to obtain a sufficient contact area, whereby contact resistance can be reduced.

One embodiment of the present invention disclosed in this specification is a semiconductor device which includes a semiconductor substrate, an insulating layer over the semiconductor substrate, an oxide semiconductor layer over the insulating layer, a gate insulating layer over the oxide semiconductor layer, a gate electrode over the gate insulating layer and overlapping with the oxide semiconductor layer, and a sidewall on a side surface of the gate electrode. The insulating layer has a groove including a deep region and a shallow region. A conductive region is provided in the groove. The sidewall overlaps with the shallow region.

In a semiconductor device having the above-described structure, another conductive layer is in contact with the sidewall and the oxide semiconductor layer.

In a semiconductor device having the above-described structure, an interlayer insulating layer is provided over the gate electrode, and a wiring is provided over the interlayer insulating layer. The wiring overlaps with the conductive region and is electrically connected to the deep region.

In a semiconductor device having the above-described structure, the conductive region includes the shallow region with a first width in the channel length direction and the deep region with a second width in the channel length direction.

A plurality of semiconductor integrated circuits may be mounted on one package, which is known as multi-chip package (MCP), so that the semiconductor device is highly integrated.

In the case where a semiconductor integrated circuit is mounted on a circuit board, the semiconductor integrated circuit may be mounted in a face-up state or a flip-chip state (face-down state).

Another embodiment of the present invention is a manufacturing method of a semiconductor device. The manufacturing method includes the steps of: forming a first insulating film over a first electrode layer; performing first planarization treatment to expose a top surface of the first electrode layer; forming a second electrode layer in contact with the top surface of the first electrode layer; forming a second insulating film over the second electrode layer; performing second planarization treatment to expose a top surface of the second electrode layer; forming an oxide semiconductor film in contact with the top surface of the second electrode layer; forming a gate insulating layer over the oxide semiconductor film; forming a gate electrode over the gate insulating layer and an insulating film covering a top surface of the gate electrode; forming a sidewall overlapping with the second electrode layer and in contact with a side surface of the gate electrode; forming, over and in contact with the oxide semiconductor film, a conductive film covering the gate electrode and the sidewall; and performing third planarization treatment for removing a part of the conductive film, which overlaps with the gate electrode.

In the case where the channel length L of a transistor used in a semiconductor integrated circuit such as an LSI, a CPU, or a memory is shortened, contact resistance of an oxide semiconductor layer is reduced to increase the operation speed of the circuit and to reduce power consumption.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and scope of the present invention. Therefore, the present invention is not construed as being limited to description of the embodiments.

Embodiment 1

Figure 1A:
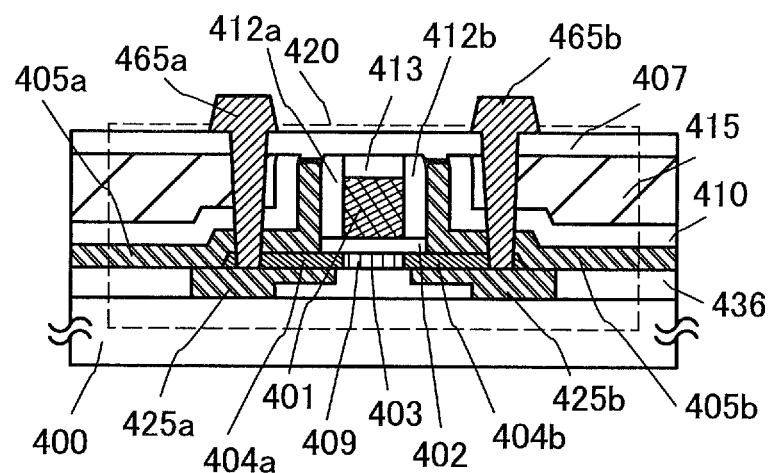
FIGS. 1A and 1B are a cross-sectional view and a top view illustrating one embodiment of the present invention.
Figure 1B:
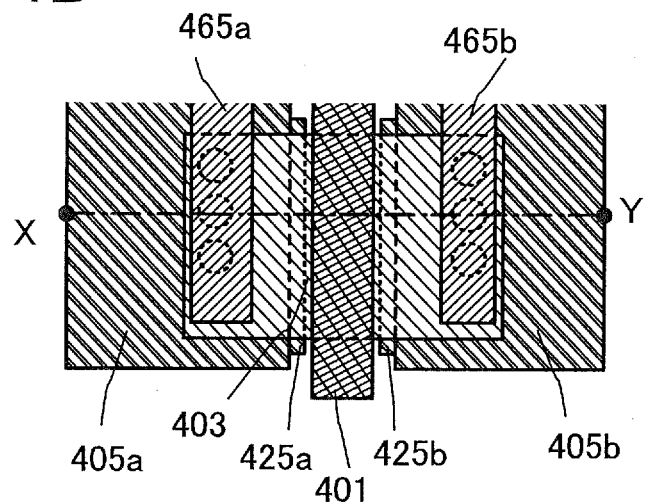

FIGS. 1A and 1B are a cross-sectional view and a top view of a transistor 420 as an example of a semiconductor device. FIG. 1A is a cross-sectional view of the transistor 420, which is taken along X-Y in FIG. 1B. Note that in FIG. 1B, some components of the transistor 420 (e.g., an insulating film 407, an insulating film 410, and an interlayer insulating film 415) are omitted for brevity.

The transistor 420 illustrated in FIGS. 1A and 1B includes, over a substrate 400 having an insulating surface, a base insulating layer 436; electrode layers 425a and 425b which are embedded in the base insulating layer 436 and have top surfaces at least partly exposed from the base insulating layer 436; an oxide semiconductor film 403 including a pair of low-resistance regions 404a and 404b and a channel formation region 409 interposed between the low-resistance regions 404a and 404b; a gate insulating layer 402 provided over the oxide semiconductor film 403; a gate electrode 401 provided over the channel formation region 409 with the gate insulating layer 402 provided therebetween; sidewall insulating layers 412a and 412b provided on side surfaces of the gate electrode 401; an insulating film 413 provided over the gate electrode 401; an insulating film 410 provided over the source electrode 405a and the drain electrode 405b; an interlayer insulating film 415 provided over the insulating film 410; an insulating film 407 provided over the interlayer insulating film 415; and a first wiring layer 465a and a second wiring layer 465b which are electrically connected to the source electrode 405a and the drain electrode 405b, respectively, through openings provided in the insulating film 407, the interlayer insulating film 415, and the insulating film 410.

The interlayer insulating film 415 is provided so that unevenness caused by the transistor 420 is removed. The height of a top surface of the interlayer insulating film 415 is substantially the same as the heights of tops surfaces of the sidewall insulating layers 412a and 412b and the insulating film 410. The sidewall insulating layers 412a and 412b are also called "sidewalls." The heights of top surfaces of the source electrode 405a and the drain electrode 405b are lower than the heights of the top surface of the interlayer insulating film 415, the top surfaces of the sidewall insulating layers 412a and 412b, and a top surface of the insulating film 413 and higher than the height of a top surface of the gate electrode 401. Note that the "height" here means a distance from a top surface of the substrate 400.

In FIGS. 1A and 1B, the electrode layers 425a and 425b are formed in the base insulating layer 436 so that grooves each including a deep region and a shallow region are filled with the electrode layers 425a and 425b. The sidewall insulating layers 412a and 412b overlap with the shallow regions. The first wiring layer 465a and the second wiring layer 465b are formed at positions overlapping with the deep regions.

Further, in FIG. 1A, the insulating film 407 is provided in contact with the interlayer insulating film 415, the source electrode 405a, the drain electrode 405b, the sidewall insulating layers 412a and 412b, the insulating film 413, and the insulating film 410.

Note that a dopant is introduced into the oxide semiconductor film 403 with the use of the gate electrode 401 as a mask so that the low-resistance regions 404a and 404b which have lower resistance than the channel formation region 409 and contains the dopant are formed in a self-aligned manner in the oxide semiconductor film 403 with the channel formation region 409 provided therebetween. The dopant is an impurity by which the electrical conductivity of the oxide semiconductor film 403 is changed. As a method for introducing the dopant, an ion implantation method, an ion doping method, a plasma immersion ion implantation method, or the like can be employed.

The transistor 420 includes the oxide semiconductor film 403 which includes the low-resistance regions 404a and 404b and the channel formation region 409 provided therebetween in the channel length direction, the source electrode 405a and the drain electrode 405b which are in contact with parts of a top surface of the oxide semiconductor film 403, and the electrode layers 425a and 425b which are in contact with parts of a bottom surface of the oxide semiconductor film 403, so that the transistor 420 has good on-state characteristics (e.g., high on-state current and high electric field mobility) and is capable of high-speed operation and high-speed response.

An oxide semiconductor used for the oxide semiconductor film 403 preferably contains at least indium (In) or zinc (Zn). In particular, In and Zn are preferably contained. In the case of using such an oxide semiconductor, as a stabilizer for reducing oxygen vacancies of the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In to Ga and Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is a natural number) may be used.

For example, an In—Ga—Zn-based oxide with an atomic ratio of In to Ga and Zn of 1:1:1 (=1/3:1/3:1/3), an atomic ratio of In to Ga and Zn of 2:2:1 (=2/5:2/5:1/5), or an atomic ratio of In to Ga and Zn of 3:1:2 (=1/2:1/6:1/3), or any of oxides with composition close to the above compositions can be used. Alternatively, an In—Sn—Zn-based oxide with an atomic ratio of In to Sn and Zn of 1:1:1 (=1/3:1/3:1/3), an atomic ratio of In to Sn and Zn of 2:1:3 (=1/3:1/6:1/2), or an atomic ratio of In to Sn and Zn of 2:1:5 (=1/4:1/8:5/8), or any of oxides with composition in the neighborhood of the above compositions may be used.

However, without limitation to the materials given above, a material with an appropriate composition may be used depending on needed semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \le r^2$, and r may be 0.05, for example. For example, r may be 0.05. The same applies to other oxides.

The oxide semiconductor film 403 is in a single crystal state, a polycrystalline (also referred to as polycrystal) state, an amorphous state, or the like.

The oxide semiconductor film is preferably a c-axis aligned crystalline oxide semiconductor (CAAC-OS) film.

Here, a c-axis aligned crystal (CAAC) refers to a mixed phase structure of a crystal region and an amorphous region, in which a c-axis is aligned in a direction perpendicular to a surface where the oxide semiconductor film is formed or a surface of the oxide semiconductor film, triangular or hexagonal atomic arrangement is formed when seen from the direction perpendicular to the a-b plane, and metal atoms are arranged in a layered manner or metal atoms and oxygen atoms are arranged in a layered manner when seen from the direction perpendicular to the c-axis. Note that in this mixed phase structure, the directions of an a-axis and a b-axis of one CAAC may be different from those of another CAAC.

The CAAC-OS film is not completely single crystal nor completely amorphous. The CAAC-OS film is an oxide semiconductor film with a crystal-amorphous mixed phase structure. The size of a crystal is estimated to be approximately several nanometers to several tens of nanometers. In observation with a transmission electron microscope (TEM), a boundary between the amorphous part and the CAAC in the CAAC-OS film is not always clear. Further, a crystal boundary (also called "grain boundary") in the CAAC-OS film is not found. Since the CAAC-OS film does not include a crystal boundary, a reduction in electron mobility due to the crystal boundary is unlikely to occur.

In the CAAC-OS film, distribution of crystal regions in the film is not necessarily uniform. For example, in the case where crystal growth occurs from a surface side of the CAAC-OS film, in some cases, the proportion of the crystal portions in the vicinity of the surface of the CAAC-OS is high and the proportion of the amorphous portions in the vicinity of the surface where the CAAC-OS film is formed is high.

Since the c-axes of the crystal parts included in the CAAC are aligned in the direction perpendicular to the surface where the CAAC-OS film is formed or the surface of the CAAC-OS film, the directions of the c-axes of the crystal parts may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part in the CAAC is substantially perpendicular to the surface where the CAAC-OS film is formed or the surface of the CAAC-OS film. The CAAC is formed by performing treatment for crystallization such as heat treatment at the same time as or after film formation.

With the use of the CAAC-OS film, change in the electric characteristics of the transistor due to irradiation with visible light or ultraviolet light can be reduced, so that the transistor can have high reliability.

Note that part of oxygen contained in the oxide semiconductor film may be substituted with nitrogen.

The oxide semiconductor film 403 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulse laser deposition method, an atomic layer deposition (ALD) method, or the like as appropriate. The oxide semiconductor film 403 may be formed with a sputtering apparatus which performs deposition in the state where top surfaces of a plurality of substrates are substantially perpendicular to a top surface of a sputtering target.

FIGS. 2A to 2E and FIGS. 3A to 3D illustrate an example of a manufacturing method of a semiconductor device including the transistor 420.

First, electrode layers 422a and 422b are formed over the substrate 400 having an insulating surface. For example, a metal film containing an element selected from Al, Cr, Cu, Ta, Ti, Mo, and W, or a metal nitride film containing any of these elements as a component (e.g., a titanium nitride film, a molybdenum nitride film, or a tungsten nitride film) can be used for the electrode layers 422a and 422b. A metal film having a high melting point such as Ti, Mo, W, or the like or a metal nitride film of any of these elements (e.g., a titanium nitride film, a molybdenum nitride film, or a tungsten nitride film) may be stacked on one of or both of a lower side or an upper side of a metal film of Al, Cu, or the like.

There is no particular limitation on a substrate that can be used as the substrate 400 having an insulating surface as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate made of silicon, silicon carbide, or the like; a compound semiconductor substrate made of silicon germanium or the like; an SOI substrate; or the like can be used as the substrate 400, or the substrate provided with a semiconductor element can be used as the substrate 400.

Figure 2A:
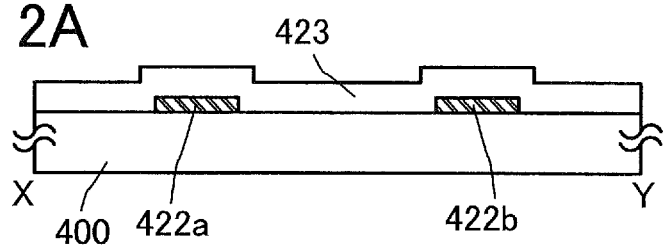
FIGS. 2A to 2E are cross-sectional views illustrating steps of one embodiment of the present invention.

Next, an insulating film 423 covering the electrode layers 422a and 422b are formed. FIG. 2A illustrates the state up to this point.

The oxide insulating film 423 can be formed by a plasma CVD method, a sputtering method, or the like, using silicon oxide, silicon oxynitride, aluminum oxide, aluminum oxynitride, hafnium oxide, gallium oxide, silicon nitride oxide, aluminum nitride oxide, or a mixed material of any of these materials.

Next, the insulating film 423 and the electrode layers 422a and 422b are cut (ground or polished). As the cutting (grinding or polishing) method, a chemical mechanical polishing (CMP) method can be suitably employed.

Then, electrode layers 424a and 424b are formed so as to overlap with the electrode layers 422a and 422b, respectively. For example, a metal film containing an element selected from Al, Cr, Cu, Ta, Ti, Mo, and W, or a metal nitride film containing any of these elements as a component (e.g., a titanium nitride film, a molybdenum nitride film, or a tungsten nitride film) can be used for the electrode layers 424a and 424b. A metal film having a high melting point such as Ti, Mo, W, or the like or a metal nitride film of any of these elements (e.g., a titanium nitride film, a molybdenum nitride film, or a tungsten nitride film) may be stacked on one of or both of a lower side or an upper side of a metal film of Al, Cu, or the like.

Figure 2B:
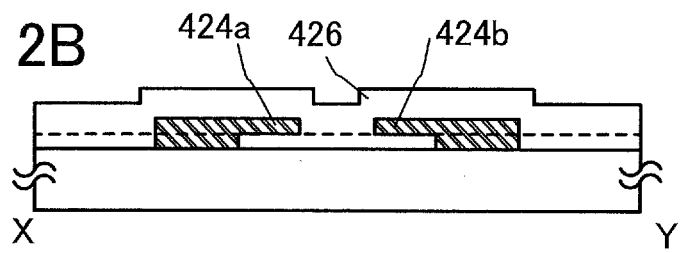

Next, an insulating film 426 covering the electrode layers 424a and 424b is formed. FIG. 2B illustrates the state up to this point. Although a boundary between the insulating film 423 and the insulating film 426 is denoted by a dashed line, a clear boundary therebetween is not formed when the insulating films 423 and 426 are formed using the same material; thus, the dashed line denoting the boundary is omitted in the following drawings and a stack of the insulating film 423 and the insulating film 426 is illustrated as the base insulating layer 436. Moreover, when the electrode layers 422a and 422b are formed using the same material as the electrode layers 424a and 424b, a clear boundary therebetween is not formed; thus, a dashed line denoting the boundary is omitted in the following drawings, and a stack of the electrode layer 422a and the electrode layer 424a and a stack of the electrode layer 422b and the electrode layer 424b are illustrated as the electrode layer 425a and the electrode layer 425b, respectively.

Next, the insulating film 426 and the electrode layers 424a and 424b are cut (ground or polished). As the cutting (grinding or polishing) method, a CMP method is employed.

Then, the oxide semiconductor film 403 is formed over the base insulating layer 436 and the electrode layers 425a and 425b.

Note that in this embodiment, as a target used for forming the oxide semiconductor film 403 by a sputtering method, an oxide target containing In, Ga, and Zn at a composition ratio of 3:1:2 [atomic ratio] is used to form an In—Ga—Zn-based oxide film (IGZO film).

It is preferable that a high-purity gas from which an impurity such as hydrogen, water, a hydroxyl group, or hydride is removed be used as a sputtering gas for forming the oxide semiconductor film 403.

The substrate is held in a deposition chamber kept under reduced pressure. Then, a sputtering gas in which impurities such as hydrogen and moisture are sufficiently removed is introduced into the deposition chamber from which remaining moisture is being removed, and the oxide semiconductor film 403 is formed over the substrate 400 with the use of the target. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with the cryopump, for example, a hydrogen atom, a compound containing a hydrogen atom, such as water ($H_2O$), (further preferably, also a compound containing a carbon atom), and the like are removed, whereby the concentration of impurities in the oxide semiconductor film 403 formed in the deposition chamber can be reduced.

The oxide semiconductor film 403 can be formed by processing an oxide semiconductor film into an island shape by a photolithography process.

A resist mask for forming the island-shaped oxide semiconductor film 403 may be formed by an inkjet method. Formation of the resist mask by an inkjet method needs no photomask; thus, manufacturing cost can be reduced.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used. The oxide semiconductor film may also be etched by dry etching using an inductively coupled plasma (ICP) etching method. For example, the IGZO film can be processed into an island shape by an ICP etching method (etching conditions: an etching gas of $BCl_3$ and $Cl_2$ ($BCl_3$:$Cl_2$=60 sccm:20 sccm), a power of 450 W, a bias power of 100 W, and a pressure of 1.9 Pa).

Further, heat treatment may be performed on the oxide semiconductor film 403 in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate is put in an electric furnace which is a kind of heat treatment apparatus, and the oxide semiconductor film 403 is subjected to the heat treatment at 450° C. for an hour in a nitrogen atmosphere.

Further, a heat treatment apparatus used is not limited to an electric furnace, and a device for heating a process object by heat conduction or heat radiation from a heating element such as a resistance heating element may be alternatively used. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows: the substrate is heated in an inert gas heated at high temperature of 650° C. to 700° C. for several minutes, and is taken out of the inert gas.

Note that in heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, more preferably 7N (99.99999%) or higher (that is, the impurity concentration is preferably 1 ppm or lower, more preferably 0.1 ppm or lower.

Note that the heat treatment for dehydration or dehydrogenation may be performed after the formation of the oxide semiconductor film or after the formation of the island-shaped semiconductor film 403.

The heat treatment for dehydration or dehydrogenation may be performed plural times and may be combined with another heat treatment.

Oxygen (which includes at least one of an oxygen radical, an oxygen atom, and an oxygen ion) may be added to the oxide semiconductor film 403 which has been subjected to the dehydration or dehydrogenation treatment to supply oxygen to the oxide semiconductor film.

Through the dehydration or dehydrogenation treatment, oxygen that is a main component material of an oxide semiconductor might be eliminated and thus might be reduced. An oxygen vacancy exists in a portion where oxygen is eliminated in an oxide semiconductor film, and a donor level which leads to a change in the electric characteristics of a transistor is formed owing to the oxygen vacancy.

Oxygen is introduced to the oxide semiconductor film 403 which has been subjected to the dehydration or dehydrogenation treatment to be supplied thereto, so that the oxide semiconductor film 403 can be a purified and i-type (intrinsic) oxide semiconductor film. Variation in electric characteristics of a transistor including the purified and i-type (intrinsic) oxide semiconductor film 403 is suppressed, and the transistor is electrically stable.

Oxygen can be introduced by an ion implantation method, an ion doping method, a plasma immersion ion implantation method, plasma treatment, or the like.

In the case where oxygen is introduced into the oxide semiconductor film 403, oxygen may be directly introduced into the oxide semiconductor film 403, or may be introduced into the oxide semiconductor film 403 through other films such as the gate insulating layer 402. An ion implantation method, an ion doping method, a plasma immersion ion implantation method, or the like may be employed for the introduction of oxygen through another film, whereas plasma treatment or the like can be employed for the introduction of oxygen directly into the exposed oxide semiconductor film 403.

The introduction of oxygen into the oxide semiconductor film 403 is preferably performed after the dehydration or dehydrogenation treatment but not limited thereto. Further, oxygen may be added plural times to the oxide semiconductor film 403 which has been subjected to the dehydration or dehydrogenation treatment.

Figure 2C:
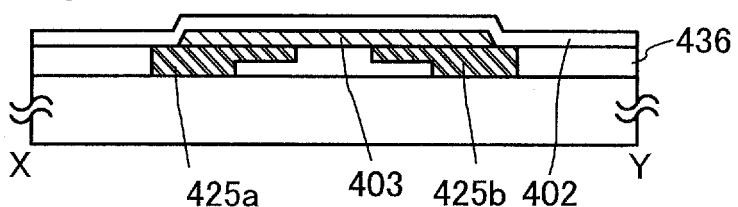

Next, the gate insulating layer 402 covering the oxide semiconductor film 403 is formed (see FIG. 2C).

The gate insulating layer 402 can have a thickness greater than or equal to 1 nm and less than or equal to 20 nm and can be formed by a sputtering method, an MBE method, a CVD method, a pulse laser deposition method, an ALD method, or the like as appropriate. The gate insulating layer 402 may be formed using a sputtering apparatus which performs film formation with surfaces of a plurality of substrates set substantially perpendicular to a surface of a sputtering target.

The gate insulating layer 402 can be formed using a silicon oxide film, a gallium oxide film, an aluminum oxide film, a silicon nitride film, a silicon oxynitride film, an aluminum oxynitride film, or a silicon nitride oxide film. It is preferable that the gate insulating layer 402 contain oxygen in a portion which is in contact with the oxide semiconductor film 403. In particular, the gate insulating layer 402 preferably contains a large amount of oxygen which exceeds at least the stoichiometry in (a bulk of) the film. For example, in the case where a silicon oxide film is used as the gate insulating layer 402, the composition formula is $SiO_{2+\alpha}$ ($\alpha>0$). In this embodiment, a silicon oxide film of $SiO_{2+\alpha}$ ($\alpha>0$) is used as the gate insulating layer 402. By using the silicon oxide film as the gate insulating layer 402, oxygen can be supplied to the oxide semiconductor film 403, leading to favorable characteristics. Further, the gate insulating layer 402 is preferably formed in consideration of the size of a transistor to be manufactured and the step coverage with the gate insulating layer 402.

When the gate insulating layer 402 is formed using a high-k material such as hafnium oxide, yttrium oxide, hafnium silicate ($HfSi_xO_y$ ($x>0$, $y>0$)), hafnium silicate ($HfSi_xO_y$ ($x>0$, $y>0$)) to which nitrogen is added, hafnium aluminate ($HfAl_xO_y$ ($x>0$, $y>0$)), or lanthanum oxide, gate leakage current can be reduced. Further, the gate insulating layer 402 may have a single-layer structure or a stacked-layer structure.

Figure 2D:
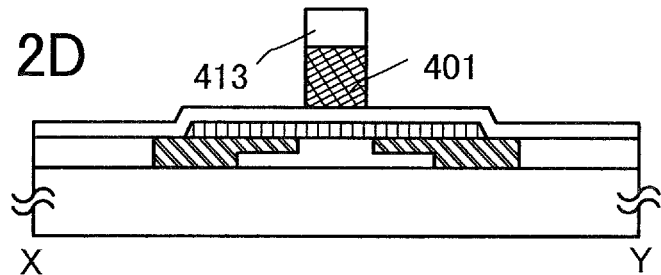

Next, a stack of a conductive film and an insulating film is formed over the gate insulating layer 402, and the conductive film and the insulating film are etched, whereby a stack of the gate electrode 401 and the insulating film 413 is formed (see FIG. 2D).

The gate electrode 401 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode 401. The gate electrode 401 may have a single-layer structure or a stacked-layer structure.

As the insulating film 413, typically, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used. The insulating film 413 can be formed by a plasma CVD method, a sputtering method, or the like.

Figure 2E:
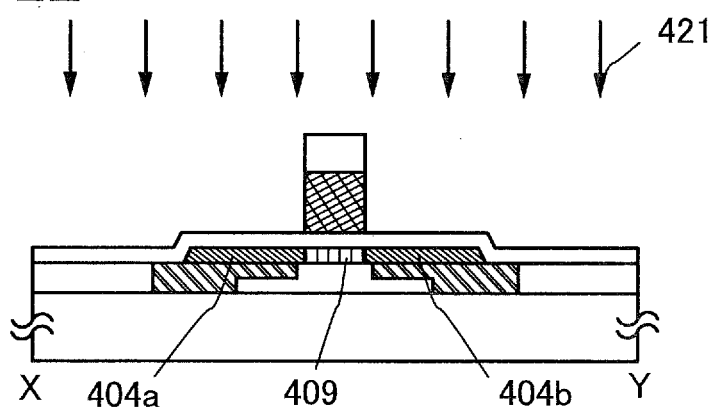

Next, a dopant 421 is introduced into the oxide semiconductor film 403 with the use of the gate electrode 401 and the insulating film 413 as masks, whereby the low-resistance regions 404a and 404b are formed (see FIG. 2E).

The dopant 421 is an impurity by which the electrical conductivity of the oxide semiconductor film 403 is changed. As the dopant 421, one or more selected from a Group 15 element (typically, phosphorus (P), arsenic (As), and antimony (Sb)), boron (B), aluminum (Al), nitrogen (N), argon (Ar), neon (Ne), indium (In), titanium (Ti), and zinc (Zn) can be used.

The dopant 421 can be introduced into the oxide semiconductor film 403 through another film (e.g., the gate insulating layer 402) by an implantation method. As a method for introducing the dopant 421, an ion implantation method, an ion doping method, a plasma immersion ion implantation method, or the like can be employed.

The introduction of the dopant 421 may be controlled by setting the addition conditions such as the accelerated voltage and the dosage, or the thickness of the films through which the dopant passes as appropriate. In this embodiment, phosphorus is used as the dopant 421, whose ion is added by an ion implantation method. Note that the dose of the dopant 421 may be greater than or equal to $1\times10^{13}$ ions/cm$^2$ and less than or equal to $5\times10^{16}$ ions/cm$^2$.

The concentration of the dopant 421 in the low-resistance regions is preferably higher than or equal to $5\times10^{18}$/cm$^3$ and lower than or equal to $1\times10^{22}$/cm$^3$.

The dopant 421 may be introduced while the substrate 400 is heated.

The introduction of the dopant 421 into the oxide semiconductor film 403 may be performed plural times, and plural kinds of dopant may be used.

Further, heat treatment may be performed after the introduction of the dopant 421. The heat treatment is preferably performed in an oxygen atmosphere for one hour at higher than or equal to 300° C. and lower than or equal to 700° C., preferably higher than or equal to 300° C. and lower than or equal to 450° C. The heat treatment may be performed under a nitrogen atmosphere, reduced pressure, or the air (ultra-dry air).

In this embodiment, phosphorus (P) ions are implanted in the oxide semiconductor film 403 by an ion implantation method. Note that the conditions of the phosphorus (P) ion implantation are as follows: the acceleration voltage is 30 kV and the dose is $1.0\times10^{15}$ ions/cm$^2$.

When the oxide semiconductor film 403 is a CAAC-OS film, the oxide semiconductor film 403 is partly amorphized by the introduction of the dopant 421 in some cases. In this case, the crystallinity of the oxide semiconductor film 403 can be recovered by performing heat treatment thereon after the introduction of the dopant 421.

Through the above-described steps, the oxide semiconductor film 403 in which the low-resistance regions 404a and 404b are provided with the channel formation region 409 provided therebetween.

Next, an insulating film is formed over the gate electrode 401 and the insulating film 413, and the insulating film is etched, whereby the sidewall insulating layers 412a and 412b are formed. In addition, part of the gate insulating layer, which does not overlap with the gate electrode 401 and the sidewall insulating layers 412a and 412b, is etched with the use of the gate electrode 401 and the sidewall insulating layers 412a and 412b as masks, whereby the gate insulating layer 402 is formed (see FIG. 3A).

The sidewall insulating layers 412a and 412b can be formed using a material and a method similar to those of the insulating film 413. In this embodiment, a silicon oxynitride film formed by a CVD method is used.

Next, a conductive film for forming a source electrode and a drain electrode (including a wiring formed from the same layer as the source electrode and the drain electrode layer) is formed over the oxide semiconductor film 403, the gate insulating layer 402, the gate electrode 401, the sidewall insulating layers 412a and 412b, and the insulating film 413.

The conductive film is formed using a material that can withstand heat treatment performed later. As the conductive film used for the source electrode and the drain electrode, for example, a metal film containing an element selected from Al, Cr, Cu, Ta, Ti, Mo, and W, a metal nitride film containing any of the above elements as its component (e.g., a titanium nitride film, a molybdenum nitride film, or a tungsten nitride film), or the like can be used. A metal film having a high melting point such as Ti, Mo, W, or the like or a metal nitride film of any of these elements (e.g., a titanium nitride film, a molybdenum nitride film, or a tungsten nitride film) may be stacked on one of or both of a lower side or an upper side of a metal film of Al, Cu, or the like.

A resist mask is formed over the conductive film by a photolithography process and the conductive film is selectively etched, whereby an island-shaped conductive film 445 is formed. After that, the resist mask is removed. Note that the conductive film 445 over the gate electrode 401 is not removed in this etching step.

In the case where a tungsten film with a thickness of 30 nm is used as the conductive film, the tungsten film may be etched by, for example, a dry etching method (etching conditions: an etching gas of $CF_4$, $Cl_2$, and $O_2$ ($CF_4$:$Cl_2$:$O_2$=55 sccm:45 sccm:55 sccm), a power of 3000 W, a bias power of 140 W, and a pressure of 0.67 Pa) to have an island shape.

Figure 3A:
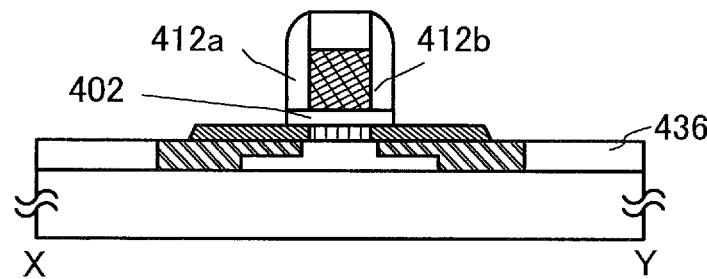
FIGS. 3A to 3D are cross-sectional views illustrating steps of one embodiment of the present invention.
Figure 3B:
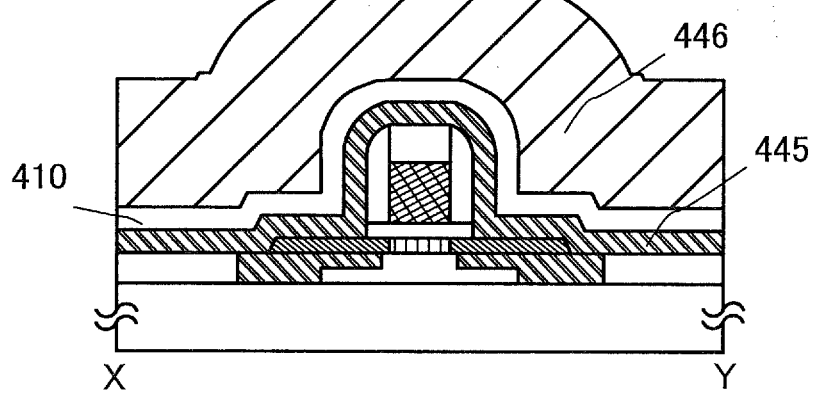

An insulating film 410 and an insulating film 446 which serve as interlayer insulating films are stacked over the island-shaped conductive film 445 (see FIG. 3B).

As the insulating film 410, an inorganic insulating film with high density (typically, an aluminum oxide film) is used. The insulating film 410 may be a single-layer film or a stacked-layer film and preferably includes at least an aluminum oxide film.

The insulating film 446 can be formed using a material and a method similar to those of the insulating film 413. The insulating film 446 is formed to a thickness by which unevenness caused by the transistor 420 can be removed. In this embodiment, a silicon oxynitride film is formed to a thickness of 300 nm by a CVD method.

Next, the insulating film 446, the insulating film 410, and the conductive film 445 are subjected to polishing treatment by a chemical mechanical polishing method, and parts of the insulating film 446, the insulating film 410, and the conductive film 445 are removed so that the insulating film 413 is exposed.

By the polishing treatment, the insulating film 446 is processed into the interlayer insulating film 415, and the conductive film 445 over the gate electrode 401 is removed, so that the source electrode 405a and the drain electrode 405b are formed.

Although the chemical mechanical polishing method is employed for removing the insulating film 446, the insulating film 410, and the conductive film 445 in this embodiment, a different cutting (grinding or polishing) method may be employed. Further, in the step of removing the conductive film 445 over the gate electrode 401, an etching (dry etching or wet etching) method, plasma treatment, or the like may be employed in addition to a cutting (grinding or polishing) method such as a chemical mechanical polishing method, an etching (dry etching or wet etching) method, plasma treatment, or the like. For example, after the removing step by a chemical mechanical polishing method, dry etching or plasma treatment (e.g., reverse sputtering) may be performed in order to improve the flatness of the processed surface. In the case where a cutting (grinding or polishing) method is combined with etching, plasma treatment, or the like, the order of the steps is not limited and may be set as appropriate in accordance with the material, thickness, and surface unevenness of the insulating film 446, the insulating film 410, and the conductive film 445.

Note that in this embodiment, the source electrode 405a and the drain electrode 405b are provided in contact with side surfaces of the sidewall insulating layers 412a and 412b provided on side surfaces of the gate electrode 401, and the source electrode 405a and the drain electrode 405b, which have upper ends positioned slightly lower than those of the sidewall insulating layers 412a and 412b, cover the side surfaces of the sidewall insulating layers 412a and 412b. The shapes of the source electrode 405a and the drain electrode 405b depend on the conditions of the polishing treatment for removing the conductive film 445; in some cases, as described in this embodiment, the source electrode 405a and the drain electrode 405b are depressed in the film thickness direction from the polished surfaces of the sidewall insulating layers 412a and 412b and the insulating film 413. However, in some cases, depending on the conditions of the polishing treatment, the positions of the upper ends of the source electrode 405a and the drain electrode 405b are substantially the same as the positions of the upper ends of the sidewall insulating layers 412a and 412b.

Figure 3C:
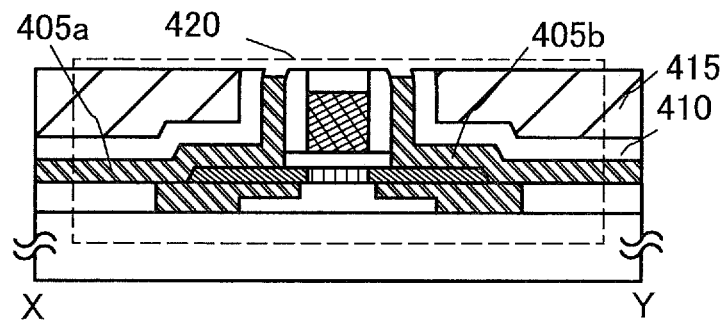

Through the above-described steps, the transistor 420 of this embodiment is manufactured (see FIG. 3C).

Such a manufacturing method makes it possible to shorten the distance between the gate electrode 401 and a region (first contact region) where the source electrode 405a or the drain electrode 405b is in contact with the oxide semiconductor film 403. Such a manufacturing method also makes it possible to shorten the distance between the gate electrode 401 and a region (second contact region) where the electrode layer 425a or 425b is in contact with the oxide semiconductor film 403. Thus, the resistance between the gate electrode 401 and the region (first contact region) where the source electrode 405a or the drain electrode 405b is in contact with the oxide semiconductor film 403 can be reduced, which results in an improvement of the on-state characteristics of the transistor 420.

In the step of removing the conductive film 445 over the gate electrode 401 for forming the source electrode 405a and the drain electrode 405b, part or all of the insulating film 413 may be removed. Part of an upper portion of the gate electrode 401 may be removed. A structure of the transistor in which the gate electrode 401 is exposed is useful in an integrated circuit in which a wiring or a semiconductor element is stacked over the transistor.

An inorganic insulating film with high density (typically, an aluminum oxide film) which serves as a protective insulating film may be provided over the transistor 420.

Figure 3D:
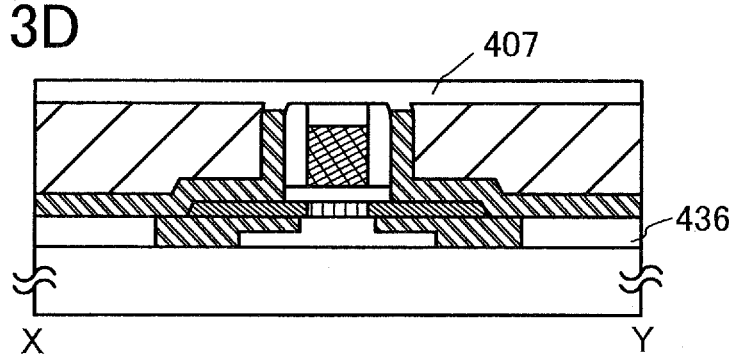

In this embodiment, the insulating film 407 is formed over and in contact with the insulating film 413, the source electrode 405a, the drain electrode 405b, the sidewall insulating layers 412a and 412b, the insulating film 410, and the interlayer insulating film 415 (see FIG. 3D).

The insulating film 407 may be a single-layer film or a stacked-layer film and preferably includes at least an aluminum oxide film.

The insulating film 407 can be formed by a plasma CVD method, a sputtering method, a vacuum evaporation method, or the like.

As the insulating films 407 and 410, an inorganic insulating film such as a silicon oxide film, a silicon oxynitride film, an aluminum oxynitride film, or a gallium oxide film can be typically used as well as an aluminum oxide film. A hafnium oxide film, a magnesium oxide film, a zirconium oxide film, a lanthanum oxide film, a barium oxide film, or a metal nitride film (e.g., an aluminum nitride film) can also be used.

In this embodiment, aluminum oxide films are formed by a sputtering method as the insulating films 407 and 410. When the aluminum oxide films have high density (film density of 3.2 $g/cm^3$ or more, preferably 3.6 $g/cm^3$ or more), the transistor 420 can have stable electric characteristics. The film density can be measured by Rutherford backscattering spectrometry (RBS) or X-ray reflectometry (XRR).

The aluminum oxide films which can be used as the insulating films 407 and 410 over the oxide semiconductor film 403 has a high shielding effect (blocking effect) of preventing penetration of both oxygen and an impurity such as hydrogen or moisture.

FIG. 1A illustrates an example in which openings reaching the source electrode 405a and the drain electrode 405b are formed in the insulating film 410, the interlayer insulating film 415, and the insulating film 407, and the wiring layers 465a and 465b are formed in the openings. The transistor 420 is connected to another transistor or an element through the wiring layers 465a and 465b, whereby a variety of circuits can be formed.

The wiring layers 465a and 465b can be formed using a material and a method similar to those of the gate electrode 401, the source electrode 405a, or the drain electrode 405b. For example, a metal film containing an element selected from Al, Cr, Cu, Ta, Ti, Mo, and W, or a metal nitride film containing any of the above elements as a component (e.g., a titanium nitride film, a molybdenum nitride film, or a tungsten nitride film) can be used. A metal film having a high melting point such as Ti, Mo, W, or the like or a metal nitride film of any of these elements (a titanium nitride film, a molybdenum nitride film, and a tungsten nitride film) may be stacked over one or both of a lower side or an upper side of a metal film of Al, Cu, or the like.

Embodiment 2

In this embodiment, an example of a semiconductor device which includes the transistor described in Embodiment 1, can hold stored data even when not powered, and does not have a limitation on the number of write cycles will be described with reference to drawings. Note that a transistor 162 included in the semiconductor device in this embodiment is the transistor 420 described in Embodiment 1.

Figure 4A:
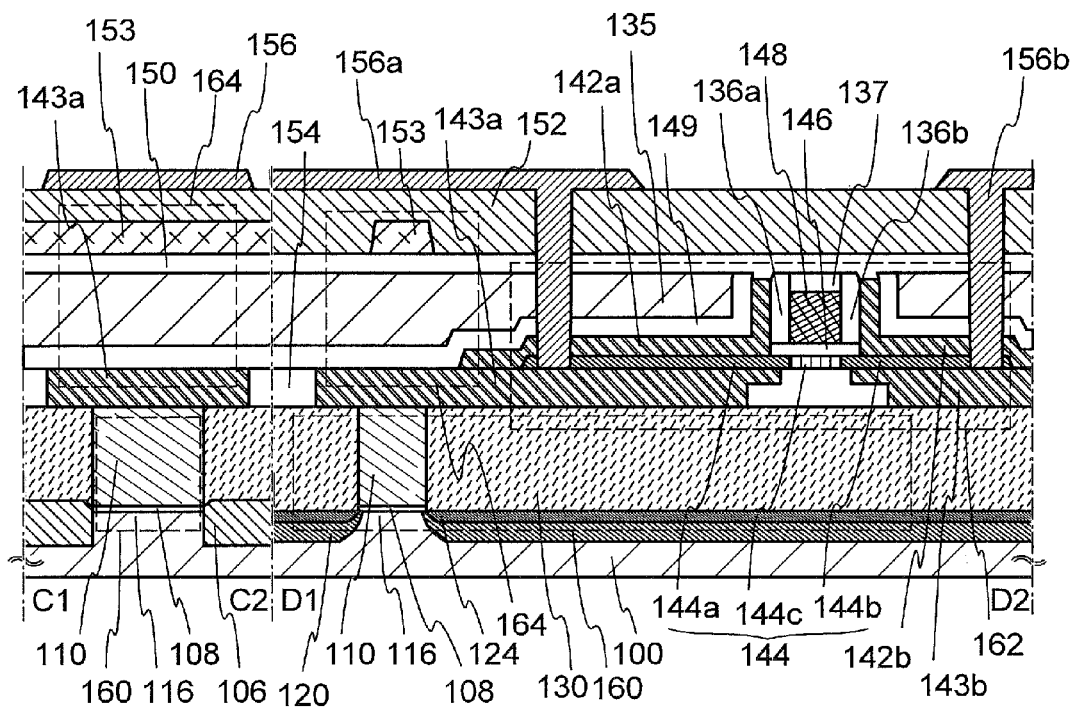
FIGS. 4A to 4C are a cross-sectional view, a plane view, and a circuit diagram illustrating one embodiment of a semiconductor device.
Figure 4B:
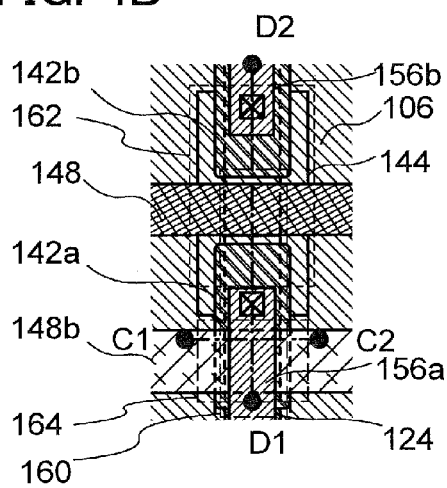
Figure 4C:
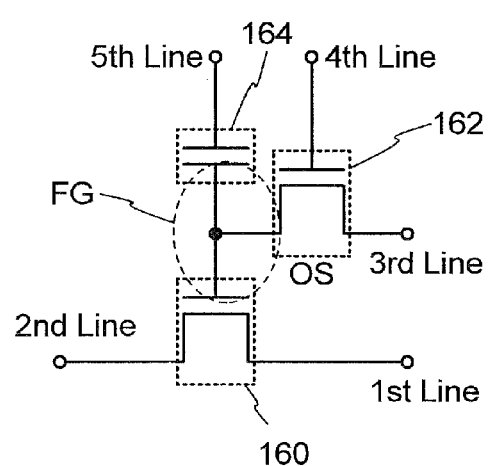

FIGS. 4A to 4C illustrate an example of a structure of a semiconductor device. FIG. 4A is a cross-sectional view of the semiconductor device, FIG. 4B is a plan view of the semiconductor device, and FIG. 4C is a circuit diagram of the semiconductor device. Here, FIG. 4A corresponds to cross sections taken along line C1-C2 and line D1-D2 in FIG. 4B.

The semiconductor device illustrated in FIGS. 4A and 4B includes a transistor 160 including a first semiconductor material in a lower portion, and the transistor 162 including a second semiconductor material in an upper portion. The transistor 162 has the same structure as the transistor 420 described in Embodiment 1.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

The transistor 162 includes an oxide semiconductor and thus has small off-state current; thus, the use of the transistor 162 enables stored data to be held for a long time. In other words, a semiconductor device in which refresh operation is not needed or the frequency of refresh operation is extremely low can be provided, which results in a sufficient reduction in power consumption.

Although all the transistors are n-channel transistors here, p-channel transistors can also be used. The technical feature of the disclosed invention is to use an oxide semiconductor in the transistor 162 so that data can be held; therefore, it is not necessary to limit a specific structure of the semiconductor device, such as a material of the semiconductor device or a structure of the semiconductor device, to the structure described here.

The transistor 160 in FIG. 4A includes a channel formation region 116 provided in a substrate 100 including a semiconductor material (e.g., silicon), impurity regions 120 provided such that the channel formation region 116 is sandwiched therebetween, intermetallic compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may be referred to as a transistor for convenience. Further, in such a case, in description of a connection of a transistor, a source region and a source electrode may be collectively referred to as a "source electrode," and a drain region and a drain electrode may be collectively referred to as a "drain electrode." That is, in this specification, the term "source electrode" may include a source region.

Element isolation insulating layers 106 are formed over the substrate 100 so that the transistor 160 is interposed therebetween. An insulating layer 130 is formed so that the transistor 160 is covered with the insulating layer 130. Note that for higher integration, the transistor 160 preferably has a structure without a sidewall insulating layer as illustrated in FIG. 4A. On the other hand, when the characteristics of the transistor 160 have priority, the sidewall insulating layers may be formed on side surfaces of the gate electrode 110, so that the impurity regions 120 each include regions having different impurity concentrations.

The transistor 162 illustrated in FIG. 4A includes an oxide semiconductor in the channel formation region. An oxide semiconductor layer 144 includes low-resistance regions 144a and 144b and a channel formation region 144c. The low-resistance region 144a is formed over and in contact with a conductive layer 143a, the low-resistance region 144b is formed over and in contact with a conductive layer 143b, and the channel formation region 144c is formed over and in contact with an insulating layer 154 interposed between the conductive layers 143a and 143b.

In a manufacturing process of the transistor 162, electrode layers 142a and 142b which function as a source electrode and a drain electrode are formed in a step of removing a conductive film provided over a gate electrode 148, an insulating film 137, and sidewall insulating layers 136a and 136b by chemical mechanical polishing treatment.

Thus, in the transistor 162, the distance between the gate electrode 148 and a region (contact region) where the electrode layer 142a or 142b which functions as a source electrode or a drain electrode is in contact with the oxide semiconductor layer 144 can be shortened. Thus, the resistance between the gate electrode 148 and the region (contact region) where the electrode layer 142a or 142b is in contact with the oxide semiconductor layer 144 can be reduced, which results in an improvement in the on-state characteristics of the transistor 162.

An insulating film 149, an interlayer insulating film 135, and an insulating film 150 each having a single-layer structure or a stacked-layer structure are provided over the transistor 162. In this embodiment, aluminum oxide films are used as the insulating film 149 and the insulating film 150. When the aluminum oxide films have high density (film density of 3.2 g/cm$^3$ or more, preferably 3.6 g/cm$^3$ or more), the transistor 162 can have stable electric characteristics.

Further, a conductive layer 153 is provided in a region overlapping with the conductive layer 143a with the insulating film 149, the interlayer insulating film 135, and the insulating film 150 provided therebetween. The conductive layer 143a, the insulating film 149, the interlayer insulating film 135, the insulating film 150, and the conductive layer 153 constitute a capacitor 164. In other words, the conductive layer 143a functions as one electrode of the capacitor 164 and the conductive layer 153 functions as the other electrode of the capacitor 164. Note that the capacitor 164 may be omitted if a capacitor is not needed. Alternatively, the capacitor 164 may be separately provided above the transistor 162.

An insulating film 152 is provided over the transistor 162 and the capacitor 164. Further, wirings 156a and 156b for connecting the transistor 162 to another transistor are provided over the insulating film 152. The wiring 156a is electrically connected to the conductive layer 143a through an opening formed in the insulating film 149, the interlayer insulating film 135, the insulating film 150, the insulating film 152, and the like. The wiring 156b is electrically connected to the conductive layer 143b through an opening formed in the insulating film 149, the interlayer insulating film 135, the insulating film 150, the insulating film 152, and the like.

In FIGS. 4A and 4B, the transistor 160 is provided so as to overlap with at least part of the transistor 162. The source region or the drain region of the transistor 160 is preferably provided so as to overlap with part of the oxide semiconductor layer 144. Further, the transistor 162 and the capacitor 164 are provided so as to overlap with at least part of the transistor 160. For example, the conductive layer 153 of the capacitor 164 is provided so as to overlap with at least part of the gate electrode 110 of the transistor 160. When such a planar layout is employed, the area occupied by the semiconductor device can be reduced; thus, the degree of integration can be increased.

FIG. 4C illustrates an example of a circuit configuration corresponding to FIGS. 4A and 4B.

In FIG. 4C, a first wiring (1st Line) is electrically connected to a source electrode of the transistor 160. A second wiring (2nd Line) is electrically connected to a drain electrode of the transistor 160. A third wiring (3rd Line) is electrically connected to one of a source electrode and a drain electrode of the transistor 162. A fourth wiring (4th Line) is electrically connected to a gate electrode of the transistor 162. A gate electrode of the transistor 160 and one of the source electrode and the drain electrode of the transistor 162 are electrically connected to one electrode of the capacitor 164. A fifth wiring (5th Line) is electrically connected to the other electrode of the capacitor 164.

The semiconductor device in FIG. 4C utilizes a characteristic in which the potential of the gate electrode of the transistor 160 can be held, and thus can write, hold, and read data as described below.

Writing and holding of data will be described. First, the potential of the fourth wiring is set to a potential at which the transistor 162 is turned on, so that the transistor 162 is turned on. Thus, the potential of the third wiring is supplied to a node (node FG) to which the gate electrode of the transistor 160 and the capacitor 164 are connected. In other words, predetermined charge is supplied to the node FG (data writing). Here, charge for supply of a potential level or charge for supply of a different potential level (hereinafter referred to as low-level charge and high-level charge) is given. After that, the potential of the fourth wiring is set to a potential at which the transistor 162 is turned off, so that the transistor 162 is turned off. Thus, the charge given to the node FG is held (data holding).

Since the off-state current of the transistor 162 is extremely small, the charge of the gate electrode of the transistor 160 is held for a long time.

Next, reading of data will be described. When an appropriate potential (reading potential) is supplied to the fifth wiring while a predetermined potential (fixed potential) is supplied to the first wiring, the potential of the second wiring varies depending on the amount of charge held in the node FG. This is generally because when the transistor 160 is an n-channel transistor, apparent threshold voltage $V_{th\_H}$ in the case where a high-level charge is supplied to the node FG (also referred to as the gate electrode of the transistor 160) is lower than apparent threshold voltage $V_{th\_L}$ in the case where a low-level charge is supplied to the node FG. Here, the apparent threshold voltage refers to the potential of the fifth wiring, which is needed to turn on the transistor 160. Thus, the potential of the fifth wiring is set to a potential $V_0$ between $V_{th\_H}$ and $V_{th\_L}$, whereby charge supplied to the node FG can be determined. For example, in the case where a high-level charge is supplied in writing, when the potential of the fifth wiring is $V_0$ ($>V_{th\_H}$), the transistor 160 is turned on. In the case where a low-level charge is supplied in writing, even when the potential of the fifth wiring is $V_0$ ($<V_{th\_L}$), the transistor 160 remains off. Therefore, the data held can be read by measuring the potential of the second wiring.

Note that in the case where memory cells are arrayed, only data of desired memory cells need to be read. In the case where such reading is not performed, a potential at which the transistor 160 is turned off regardless of the state of the gate electrode of the transistor 160, that is, a potential smaller than $V_{th\_H}$ may be supplied to the fifth wiring. Alternatively, a potential at which the transistor 160 is turned on regardless of the state of the gate electrode, that is, a potential higher than $V_{th\_L}$ may be supplied to the fifth wiring.

When a transistor which includes a channel formation region formed using an oxide semiconductor and has extremely small off-state current is applied to the semiconductor device in this embodiment, the semiconductor device can hold data for an extremely long period. In other words, refresh operation is not needed or the frequency of the refresh operation can be extremely low, which results in a sufficient reduction in power consumption. Moreover, stored data can be held for a long time even during a period in which power is not supplied (the potential is preferably fixed).

Further, the semiconductor device described in this embodiment does not need high voltage for writing data and has no problem of deterioration of elements. For example, unlike a conventional non-volatile memory, it is not necessary to inject and extract electrons into and from a floating gate; thus, a problem such as deterioration of a gate insulating layer does not occur at all. In other words, the semiconductor device according to one embodiment of the present invention does not have a limit on the number of write cycles, which is a problem in a conventional nonvolatile memory, and reliability thereof is drastically improved. Furthermore, data is written depending on the on state and the off state of the transistor, whereby high-speed operation can be easily achieved.

Further, in the transistor 162, the low-resistance region 144a in the oxide semiconductor layer is in contact with the conductive layer 143a embedded in a base insulating layer and the electrode layer 142a to be electrically connected thereto, so that contact resistance can be reduced; thus, the transistor 162 can have excellent electric characteristics (e.g., high on-state current). Therefore, the use of the transistor 162 allows higher performance of the semiconductor device. Moreover, the transistor 162 has high reliability; thus, higher reliability of the semiconductor device can be achieved.

The structures, methods, and the like described in this embodiment can be combined as appropriate with any of the structures, methods, and the like described in the other embodiments.

Embodiment 3

In this embodiment, a semiconductor device which includes the transistor described in Embodiment 1, can hold stored data even when not powered, does not have a limitation on the number of write cycles, and has a structure different from the structure described in Embodiment 2 will be described with reference to FIGS. 5A and 5B and FIGS. 6A to 6C. Note that the transistor 162 included in the semiconductor device in this embodiment is the transistor described in Embodiment 1.

Figure 5A:
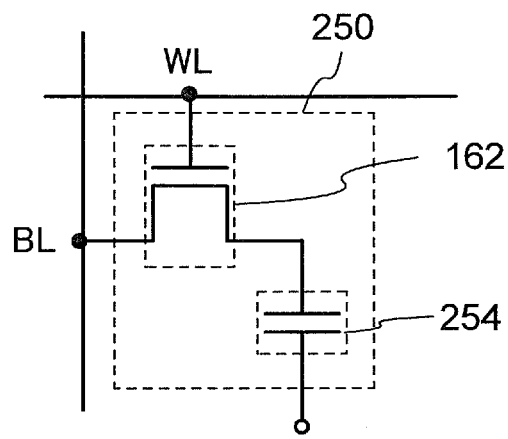
FIGS. 5A and 5B are a circuit diagram and a perspective view illustrating one embodiment of a semiconductor device.
Figure 5B:
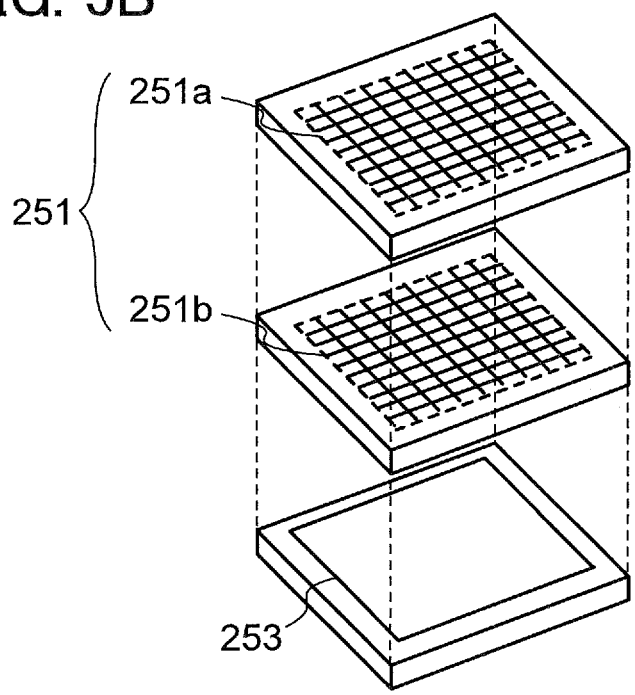

FIG. 5A illustrates an example of a circuit configuration of a semiconductor device, and FIG. 5B is a conceptual diagram illustrating an example of a semiconductor device. First, the semiconductor device illustrated in FIG. 5A will be described, and then the semiconductor device illustrated in FIG. 5B will be described.

In the semiconductor device illustrated in FIG. 5A, a bit line BL is electrically connected to the source electrode or the drain electrode of the transistor 162, a word line WL is electrically connected to the gate electrode of the transistor 162, and the source electrode or the drain electrode of the transistor 162 is electrically connected to a first terminal of a capacitor 254.

Moreover, the transistor 162 including an oxide semiconductor has extremely small off-state current. For that reason, the potential of the first terminal of the capacitor 254 (or charge accumulated in the capacitor 254) can be held for an extremely long period by turning off the transistor 162.

Next, writing and holding of data in the semiconductor device (a memory cell 250) illustrated in FIG. 5A will be described.

First, the potential of the word line WL is set to a potential at which the transistor 162 is turned on, so that the transistor 162 is turned on. Thus, the potential of the bit line BL is supplied to the first terminal of the capacitor 254 (data writing). After that, the potential of the word line WL is set to a potential at which the transistor 162 is turned off, so that the transistor 162 is turned off. Thus, the potential at the first terminal of the capacitor 254 is held (data holding).

Since the off-state current of the transistor 162 is extremely small, the potential of the first terminal of the capacitor 254 (or the charge accumulated in the capacitor) can be held for a long time.

Next, reading of data will be described. When the transistor 162 is turned on, the bit line BL which is in a floating state and the capacitor 254 are electrically connected to each other, and the charge is redistributed between the bit line BL and the capacitor 254. As a result, the potential of the bit line BL changes. The amount of change in the potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as "bit line capacitance"), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparison between the potential of the bit line BL and a predetermined potential, data can be read.

As described above, the semiconductor device illustrated in FIG. 5A can hold charge that is accumulated in the capacitor 254 for a long time because the off-state current of the transistor 162 is extremely small. In other words, refresh operation is not needed or the frequency of refresh operation can be extremely low, which results in a sufficient reduction in power consumption. Moreover, stored data can be held for a long time even during a period in which power is not supplied.

Next, the semiconductor device illustrated in FIG. 5B will be described.

The semiconductor device illustrated in FIG. 5B includes memory cell arrays 251a and 251b each having a plurality of memory cells 250 illustrated in FIG. 5A in an upper portion and a peripheral circuit 253 for operating the memory cell arrays 251a and 251b in a lower portion. Note that the peripheral circuit 253 is electrically connected to the memory cell arrays 251a and 251b.

In the structure illustrated in FIG. 5B, the peripheral circuit 253 can be provided directly under the memory cell arrays 251a and 251b. Thus, a reduction in the size of the semiconductor device can be achieved.

It is preferable that a semiconductor material of the transistor provided in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Thus, the transistor enables a variety of circuits (e.g., a logic circuit and a driver circuit) which need to operate at high speed to be favorably obtained.

Note that FIG. 5B illustrates, as an example, the semiconductor device in which two memory cell arrays, the memory cell array 251a and the memory cell array 251b, are stacked; however, the number of memory cell arrays to be stacked is not limited thereto. Three or more memory cell arrays may be stacked.

Next, a specific structure of the memory cell 250 illustrated in FIG. 5A will be described with reference to FIGS. 6A to 6C.

Figure 6A:
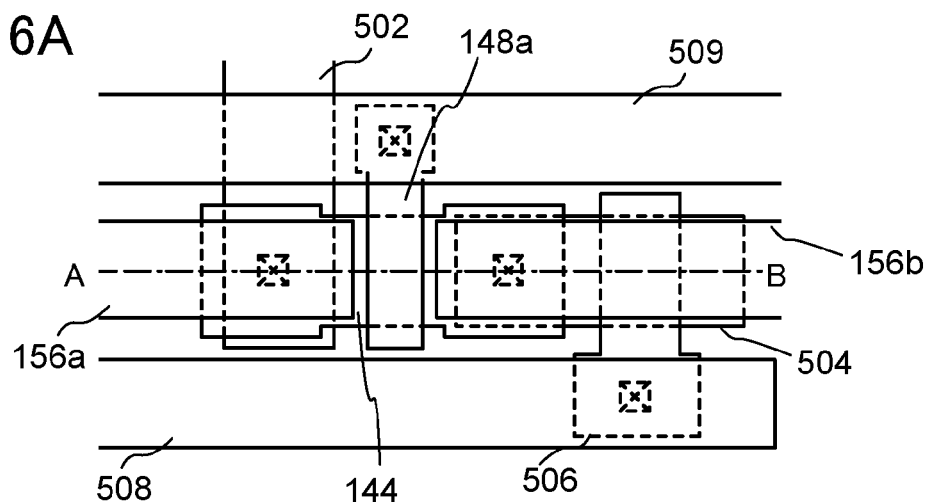
FIGS. 6A to 6C are a plane view and cross-sectional views illustrating one embodiment of a semiconductor device.
Figure 6B:
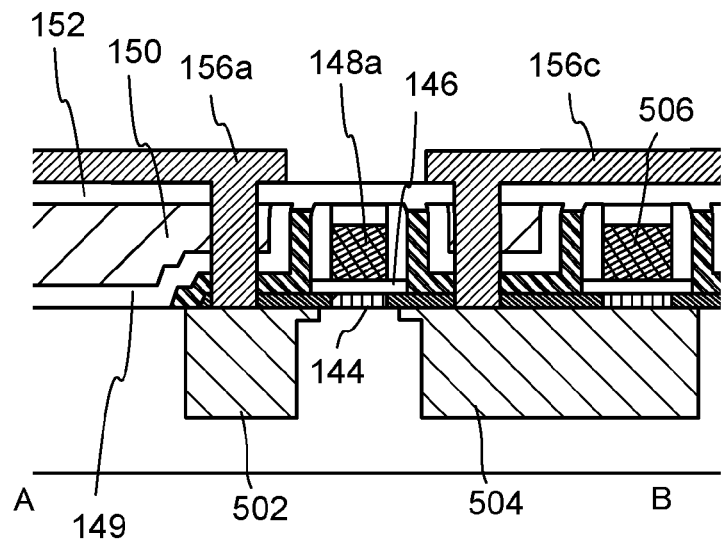
Figure 6C:
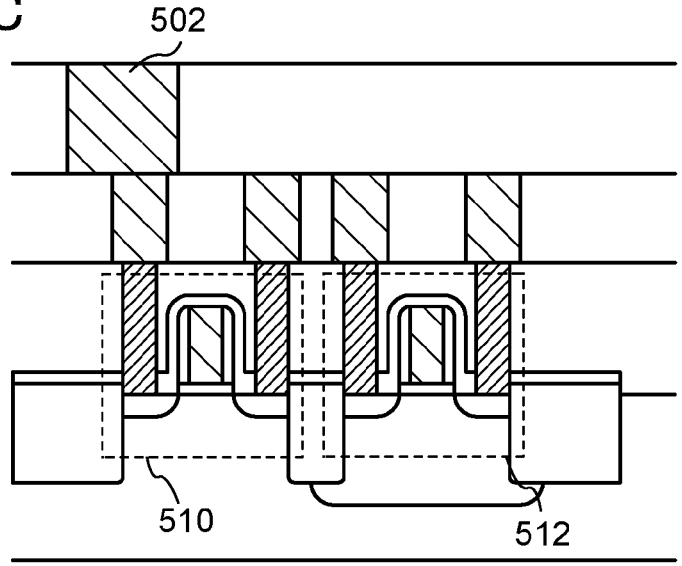

FIGS. 6A to 6C illustrate an example of a structure of the memory cell 250. FIG. 6A is a plan view of the memory cell 250. FIG. 6B is a cross-sectional view taken along line A-B in FIG. 6A.

The transistor illustrated in FIGS. 6A and 6B can have the same structure as the transistor described in Embodiment 1.

As illustrated in FIG. 6B, the transistor is formed over an electrode 502 and an electrode 504. The electrode 502 serves as a bit line BL in FIG. 5A and is in contact with a low-resistance region of the transistor. The electrode 504 serves as one electrode of the capacitor 254 in FIG. 5A and is in contact with the low-resistance region of the transistor. Over the transistor, the electrode 506 provided in a region overlapping with the electrode 504 serves as the other electrode of the capacitor 254.

As illustrated in FIG. 6A, the other electrode 506 of the capacitor 254 is electrically connected to a capacitor line 508. A gate electrode 148a over the oxide semiconductor layer 144 with the gate insulating layer 146 provided therebetween is electrically connected to a word line 509.

FIG. 6C is a cross-sectional view in a connection portion between the memory cell array and a peripheral circuit. The peripheral circuit can include, for example, an n-channel transistor 510 and a p-channel transistor 512. The n-channel transistor 510 and the p-channel transistor 512 are preferably formed using a semiconductor material other than an oxide semiconductor (e.g., silicon). With such a material, the transistor included in the peripheral circuit can operate at high speed.

When the planar layout illustrated in FIG. 6A is employed, the area occupied by the semiconductor device can be reduced; thus, the degree of integration can be increased.

As described above, the plurality of memory cells formed in multiple layers in the upper portion each include a transistor including an oxide semiconductor. Since the off-state current of the transistor including a purified and intrinsic oxide semiconductor is small, stored data can be held for a long time with the use of the transistor. In other words, the frequency of refresh operation can be extremely lowered, which results in a sufficient reduction in power consumption. Further, the capacitor 254 is formed by stacking the electrode 504, the oxide semiconductor layer 144, the gate insulating layer 146, and the electrode 506 as illustrated in FIG. 6B.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor with sufficiently small off-state current). Further, with a structure in which the peripheral circuit and the memory circuit are stacked, higher integration of the integration of the semiconductor device can be achieved.

This embodiment can be combined with any of the structures described in the other embodiments as appropriate.

Embodiment 4

In this embodiment, examples of application of the semiconductor device described in any of the above embodiments to portable devices such as a mobile phone, a smartphone, or an e-book reader will be described with reference to FIGS. 7A and 7B, FIG. 8, FIG. 9, and FIG. 10.

In portable electronic devices such as a mobile phone, a smart phone, and an e-book reader, an SRAM or a DRAM is used to store image data temporarily. This is because response speed of a flash memory is low and thus a flash memory is not suitable for image processing. On the other hand, an SRAM or a DRAM has the following characteristics when used for temporary storage of image data.

Figure 7A:
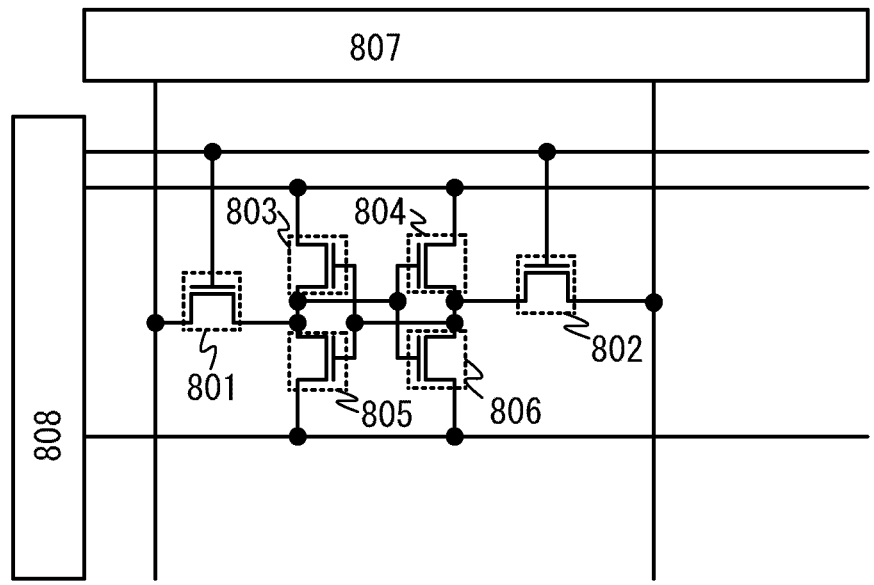
FIGS. 7A and 7B are circuit diagrams each illustrating one embodiment of a semiconductor device.

In a normal SRAM, as illustrated in FIG. 7A, one memory cell includes six transistors, which are a transistor 801, a transistor 802, a transistor 803, a transistor 804, a transistor 805, and a transistor 806, and they are driven by an X decoder 807 and a Y decoder 808. A pair of transistors 803 and 805 and a pair of the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, the price per bit of an SRAM is the highest among a variety of memory devices.

Figure 7B:
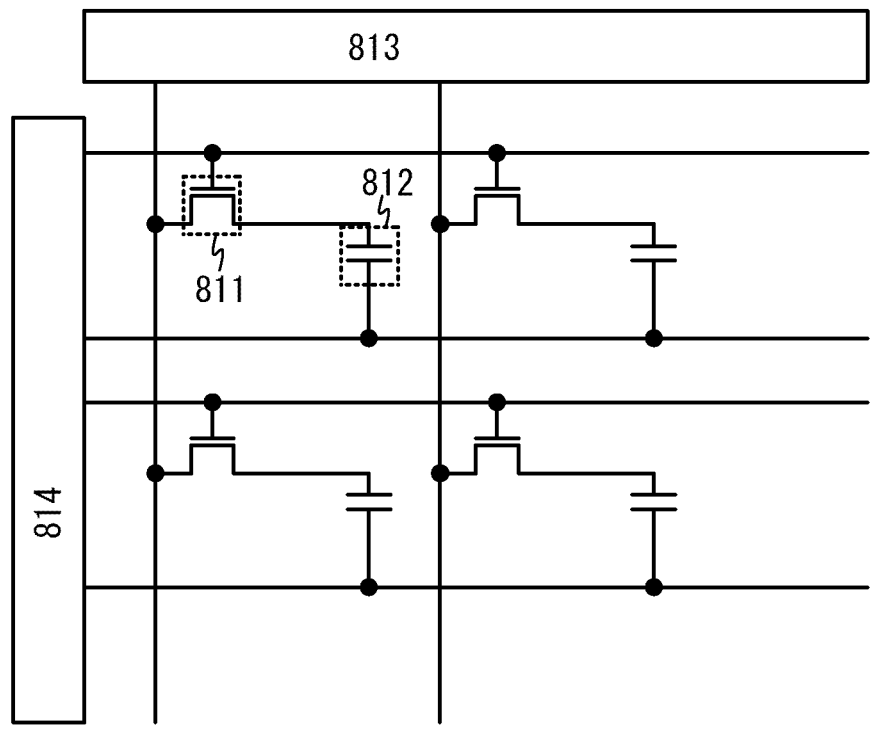

On the other hand, as illustrated in FIG. 7B, a memory cell in a DRAM includes a transistor 811 and a storage capacitor 812, and is driven by an X decoder 813 and a Y decoder 814. One cell includes one transistor and one capacitor and has a small area. The area of a memory cell in a DRAM is generally less than or equal to 10 $F^2$. Note that the DRAM needs to be refreshed periodically and consumes electric power even when a rewriting operation is not performed.

However, the area of the memory cell of the semiconductor device described in the above embodiments is about 10 $F^2$ and frequent refreshing is not needed. Therefore, the area of the memory cell can be reduced, which results in a reduction in power consumption.

Figure 8:
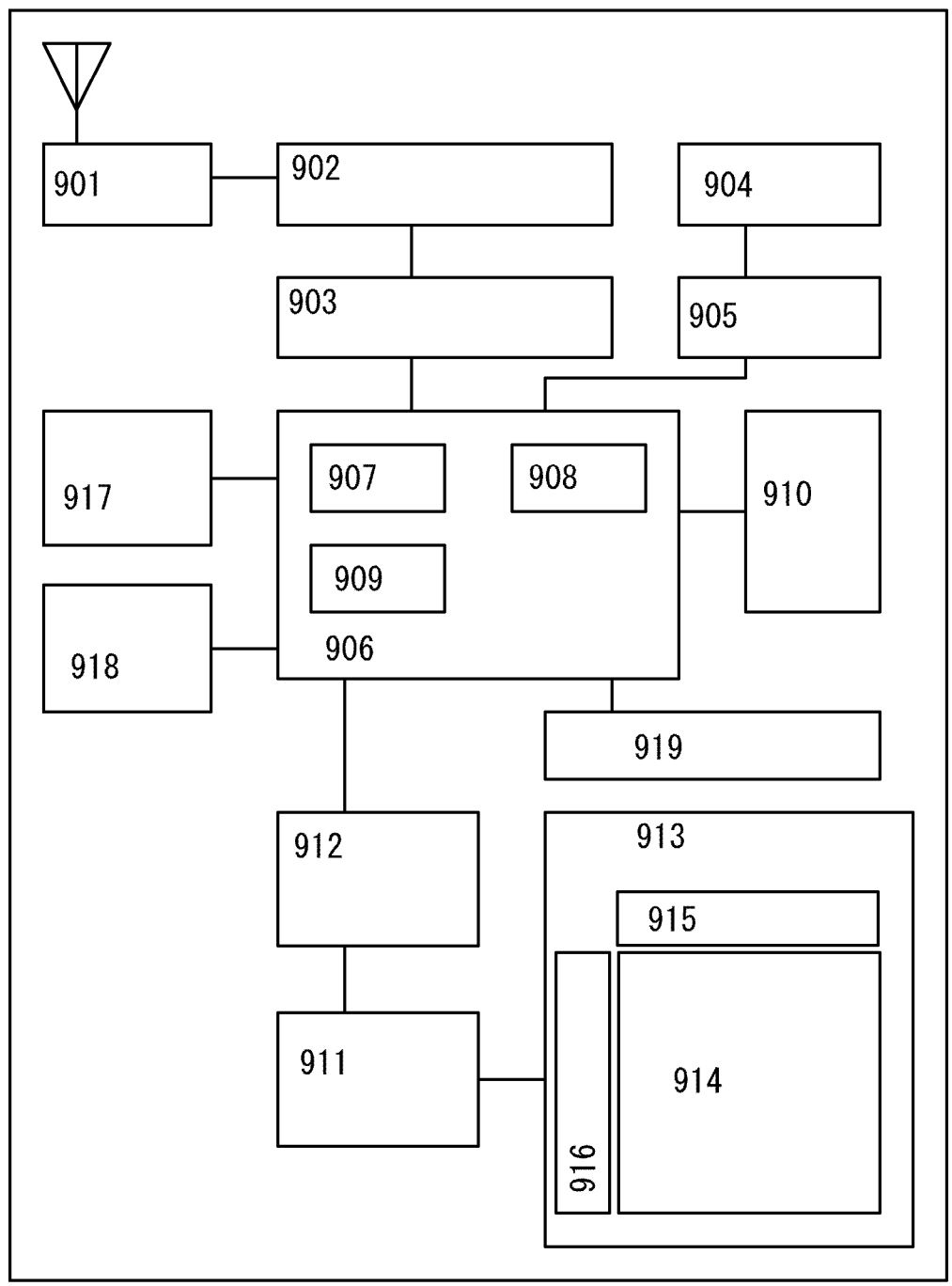
FIG. 8 is a block diagram illustrating one embodiment of a semiconductor device.

FIG. 8 is a block diagram of a portable device. A portable device illustrated in FIG. 8 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing any of the semiconductor devices described in the above embodiments for the memory circuit 912, writing and reading of data can be performed at high speed, data can be held for a long time, and power consumption can be sufficiently reduced.

Figure 9:
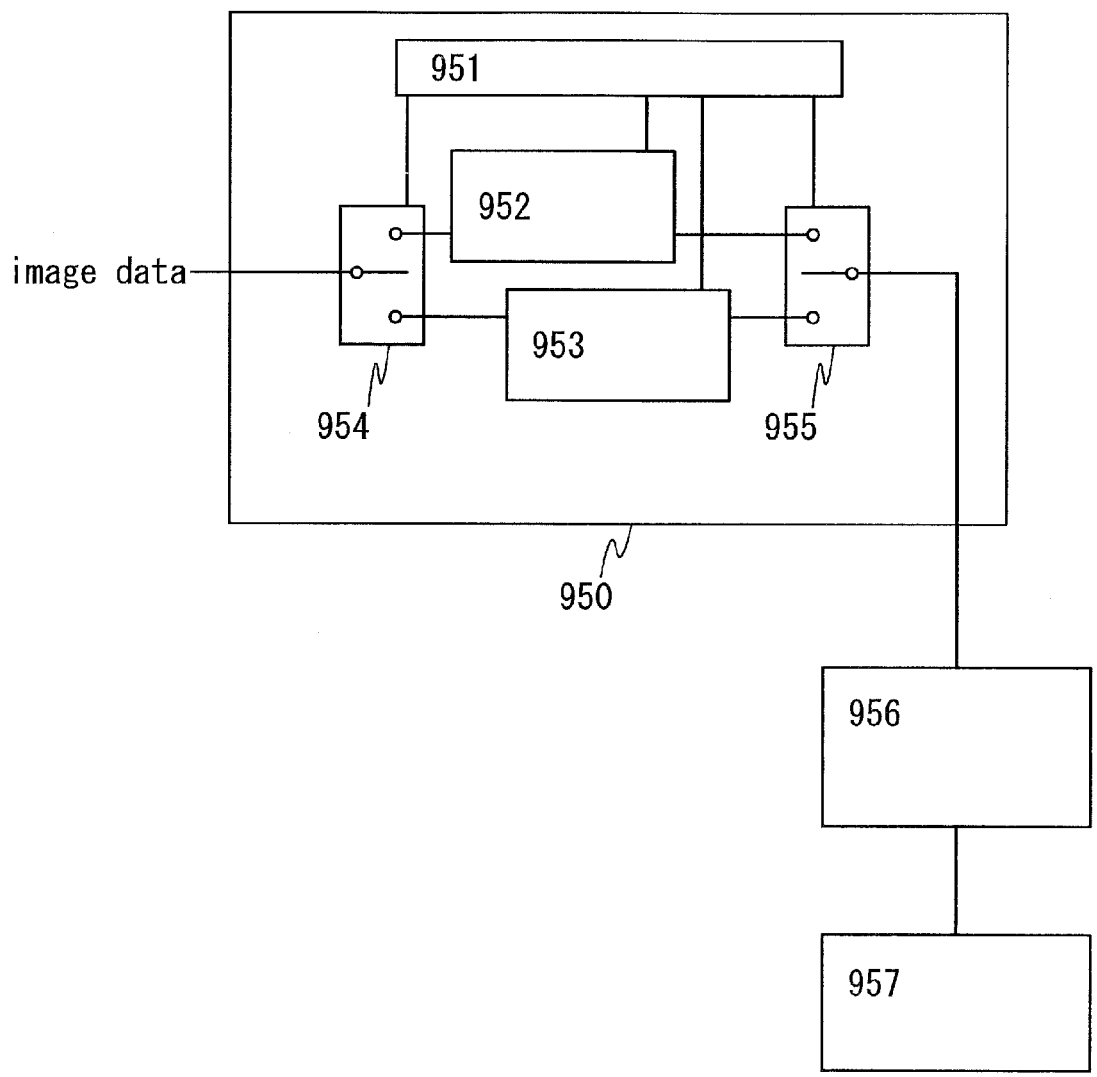
FIG. 9 is a block diagram illustrating one embodiment of a semiconductor device.

FIG. 9 illustrates an example in which any of the semiconductor devices described in the above embodiments is used for a memory circuit 950 in a display. The memory circuit 950 illustrated in FIG. 9 includes a memory 952, a memory 953, a switch 954, a switch 955, and a memory controller 951. Further, the memory circuit 950 is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not illustrated). The input image data A is stored in the memory 952 though the switch 954. The image data (stored image data A) stored in the memory 952 is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during this time, the stored image data A is regularly read from the memory 952 through the switch 955. After the completion of storing the new image data (stored image data B) in the memory 953, from the next frame for the display 957, the stored image data B starts to be read, is transmitted to the display 957 through the switch 955 and the display controller 956, and is displayed on the display 957. This reading operation continues until another next new image data is stored in the memory 952.

By alternately writing and reading image data to and from the memory 952 and the memory 953 as described above, images are displayed on the display 957. Note that the memory 952 and the memory 953 are not necessarily separate memories and a single memory may be divided and used. By employing any of the semiconductor devices described in the above embodiments for the memory 952 and the memory 953, data can be written and read at high speed and held for a long time, and power consumption can be sufficiently reduced.

Figure 10:
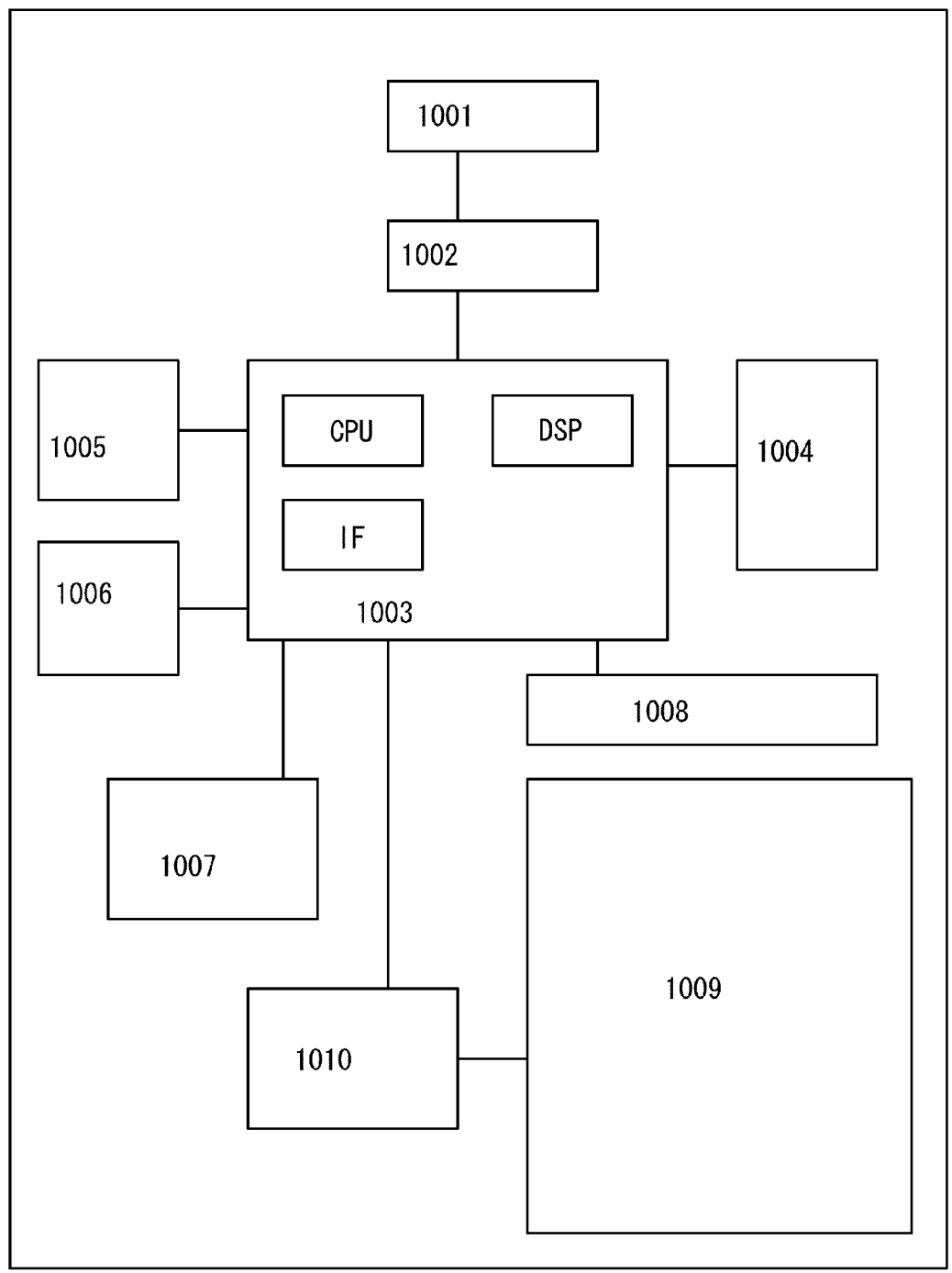
FIG. 10 is a block diagram illustrating one embodiment of a semiconductor device.

FIG. 10 is a block diagram of an e-book reader. FIG. 10 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, any of the semiconductor devices described in the above embodiments can be used for the memory circuit 1007 in FIG. 10. The memory circuit 1007 has a function to temporarily hold the contents of a book. For example, the memory circuit 1007 has a function to temporarily store and hold data on a portion specified by a user when the user reads an electronic book and wants to mark the specified portion (e.g., to change the display color, underline, make the text bold, or change the font of text) in the electronic book. In order to save the data for a long time, the data may be copied to the flash memory 1004. Also in such a case, by employing any of the semiconductor device described in the above embodiments, data can be written and read at high speed and held for a long time, and power consumption can be sufficiently reduced.

As described above, the portable devices described in this embodiment each incorporate any of the semiconductor devices according to the above embodiments. Therefore, it is possible to obtain a portable device in which data is read at high speed, the data is held for a long time, and power consumption is sufficiently reduced.

The structures, methods, and the like described in this embodiment can be combined as appropriate with any of the structures, methods, and the like described in the other embodiments.

This application is based on Japanese Patent Application serial no. 2011-225524 filed with Japan Patent Office on Oct. 13, 2011, the entire contents of which are hereby incorporated by reference.

What is claimed is:

1. A semiconductor device comprising:
a semiconductor substrate;
an insulating layer over the semiconductor substrate, the insulating layer comprising a groove in which a conductive film comprising a first region and a second region is provided;
an oxide semiconductor film comprising a third region and a fourth region over a top surface of the insulating layer;
a gate insulating layer over the oxide semiconductor film;
a gate electrode over the gate insulating layer, the gate electrode overlapping with the third region; and
a sidewall in contact with a side surface of the gate electrode and a top surface of the gate insulating layer,
wherein the second region is over the first region,
wherein a width of the second region is greater than a width of the first region, and
wherein the fourth region is over and in contact with the second region.

2. The semiconductor device according to claim 1, wherein a conductive layer is in contact with the sidewall and the oxide semiconductor film.

3. The semiconductor device according to claim 1, further comprising:
an interlayer insulating layer over the gate electrode; and
a wiring over the interlayer insulating layer,
wherein the wiring is electrically connected to the conductive film.

4. The semiconductor device according to claim 1, wherein the oxide semiconductor film contains indium, gallium, and zinc.

5. The semiconductor device according to claim 1, wherein the oxide semiconductor film contains indium, tin, and zinc.

6. A semiconductor device comprising:
a semiconductor substrate;
an insulating layer over the semiconductor substrate, the insulating layer comprising a groove in which a conductive film comprising a first region and a second region is provided;
an oxide semiconductor film comprising a third region and a fourth region over a top surface of the insulating layer;
a gate insulating layer over the oxide semiconductor film;
a gate electrode over the gate insulating layer, the gate electrode overlapping with the third region; and
a sidewall in contact with a side surface of the gate electrode and a top surface of the gate insulating layer,
wherein the second region is over the first region,
wherein a width of the second region is greater than a width of the first region,
wherein the fourth region is over and in contact with the second region, and
wherein a top surface of the conductive film is a same as the top surface of the insulating layer.

7. The semiconductor device according to claim 6, wherein a conductive layer is in contact with the sidewall and the oxide semiconductor film.

8. The semiconductor device according to claim 6, further comprising:
an interlayer insulating layer over the gate electrode; and
a wiring over the interlayer insulating layer,
wherein the wiring is electrically connected to the conductive film.

9. The semiconductor device according to claim 6, wherein the oxide semiconductor film contains indium, gallium, and zinc.

10. The semiconductor device according to claim 6, wherein the oxide semiconductor film contains indium, tin, and zinc.

* * * * *